United States Patent [19]
Oku et al.

[11] Patent Number: 5,675,159
[45] Date of Patent: Oct. 7, 1997

[54] RECESSED GATE FIELD EFFECT TRANSISTOR

[75] Inventors: Tomoki Oku; Nobuyuki Kasai, both of Tokyo, Japan

[73] Assignee: Mitsubishi Denki Kabushiki Kaisha, Tokyo, Japan

[21] Appl. No.: 583,384

[22] Filed: Jan. 5, 1996

[30] Foreign Application Priority Data

Mar. 24, 1995 [JP] Japan ................... 7-066094

[51] Int. Cl.$^6$ ............................. H01L 29/812
[52] U.S. Cl. ........................ 257/284; 257/473
[58] Field of Search ......................... 257/280–284, 257/473

[56] References Cited

U.S. PATENT DOCUMENTS

| | | |
|---|---|---|
| 4,160,984 | 7/1979 | Ladd et al. ............... 257/284 |
| 4,845,534 | 7/1989 | Fukuta ..................... 257/473 |
| 4,889,827 | 12/1989 | Willer ..................... 257/284 |
| 4,984,036 | 1/1991 | Sakamoto et al. ....... 257/284 |
| 5,409,849 | 4/1995 | Kishita et al. .......... 257/284 |
| 5,536,967 | 7/1996 | Yokoyama ................ 257/473 |
| 5,539,228 | 7/1996 | Chi ......................... 257/284 |
| 5,548,144 | 8/1996 | Kohno ..................... 257/284 |

FOREIGN PATENT DOCUMENTS 4259258  9/1992  Japan .

OTHER PUBLICATIONS

Takahashi et al, "Step–Recessed Gate GaAs FETs With An Undoped Surface Layer", IEEE Electron Devices Society, vol. IEDM 91–259, 1991, pp. 9.8.1–9.8.4 No month.

*Primary Examiner*—Gene M. Munson
*Attorney, Agent, or Firm*—Leydig, Voit & Mayer

[57] ABSTRACT

A semiconductor device includes a compound semiconductor body having a recess, the recess having a bottom and a hollow, and a refractory metal gate electrode having a lower portion within the hollow. The compound semiconductor body includes a compound semiconductor substrate; a channel layer including a compound semiconductor of a first conductivity type, the channel layer being located on the substrate between the gate electrode and the substrate; first active layers of the compound semiconductor and of the first conductivity type located on regions of the substrate in the recess where the channel layer is not present; and second active layers of the compound semiconductor and of the first conductivity type located on regions of the substrate in the recess where the channel layer is not present; and second active layers of the compound semiconductor of the first conductivity type located on regions of the substrate sandwiching the recess. Therefore, the controllable region in the channel layer is not adversely affected by a depletion layer produced at the interface between the first active layers and a passivation film, whereby an unwanted reduction in the control speed in the channel layer due to the charging and discharging of carriers in traps at the interface is avoided.

11 Claims, 11 Drawing Sheets

Fig.9 (a) PRIOR ART
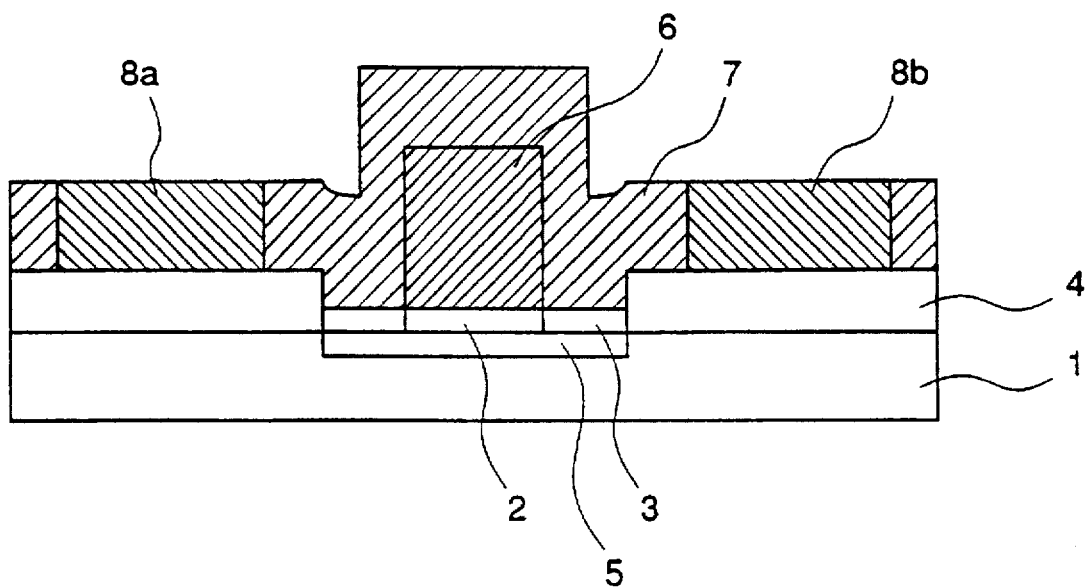
Fig.9 (b) PRIOR ART
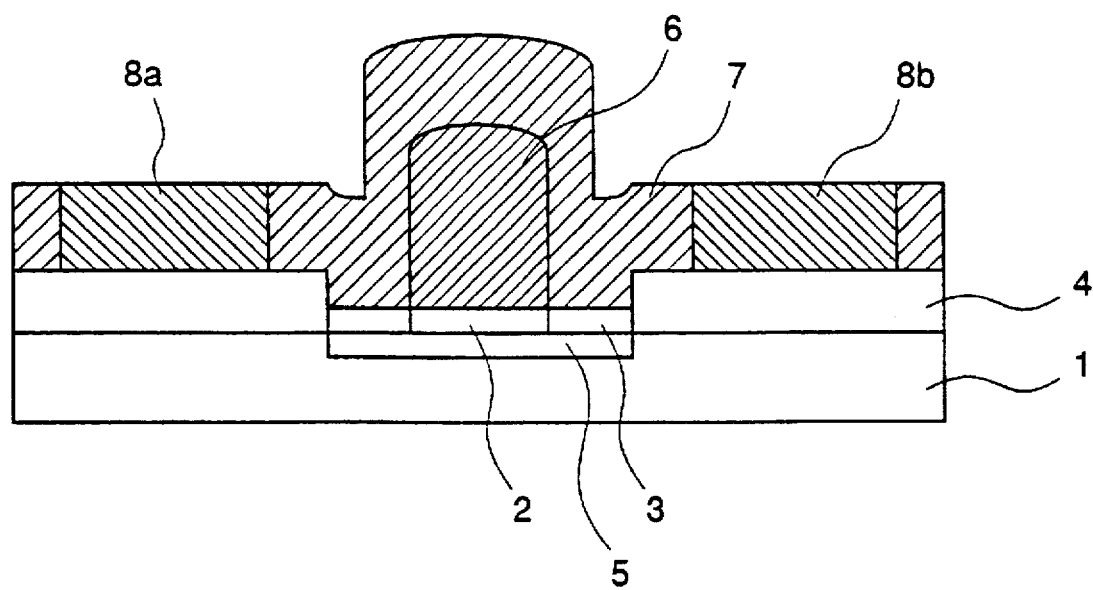

Fig.10 (a) PRIOR ART
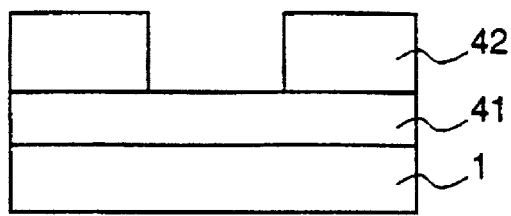
Fig.10 (e) PRIOR ART
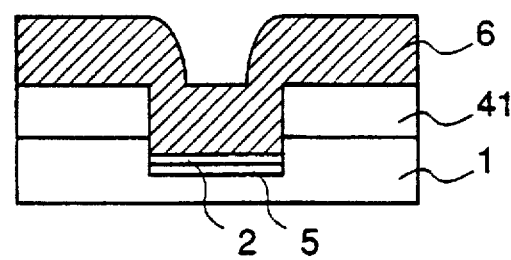
Fig.10 (b) PRIOR ART
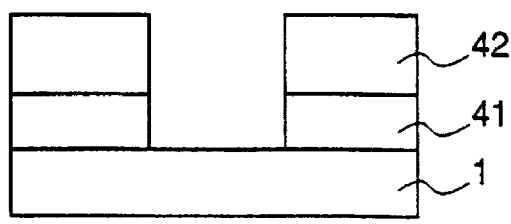
Fig.10 (f) PRIOR ART
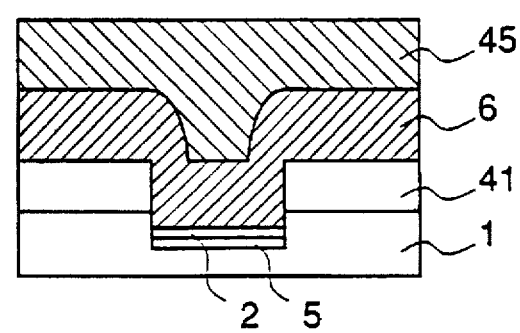
Fig.10 (c) PRIOR ART
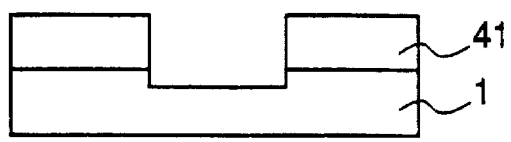
Fig.10 (g) PRIOR ART
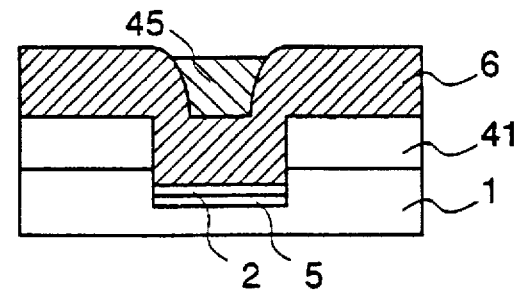
Fig.10 (d) PRIOR ART
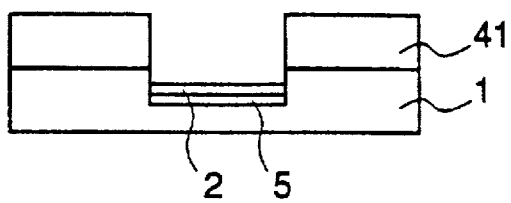

Fig.10 (h) PRIOR ART
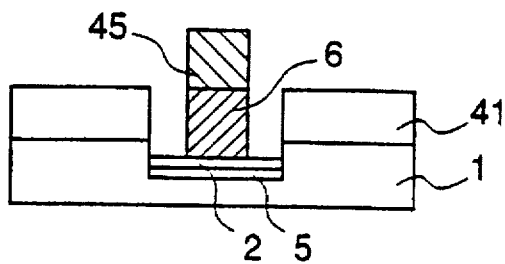
Fig.10 (i) PRIOR ART
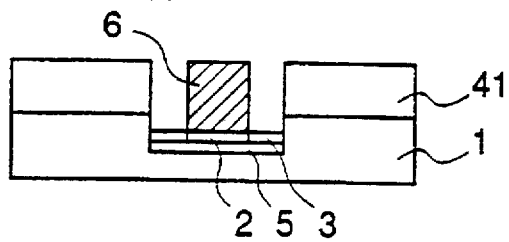
Fig.10 (j) PRIOR ART
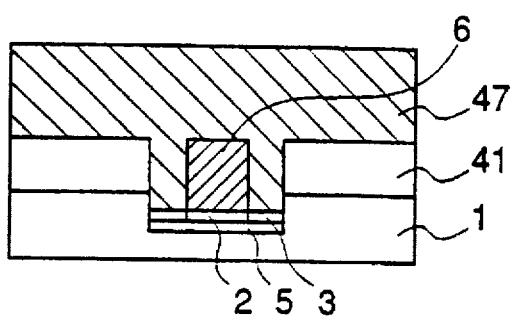
Fig.10 (k) PRIOR ART
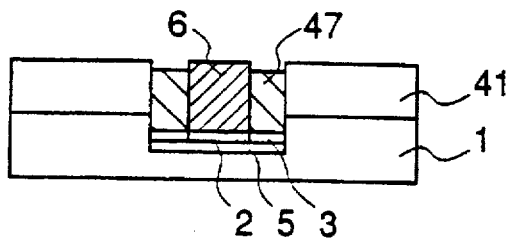
Fig.10 (l) PRIOR ART
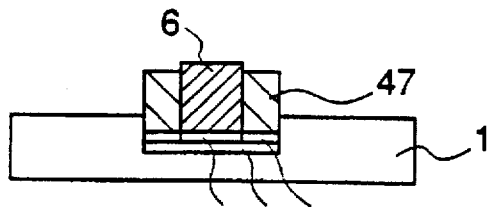
Fig.10 (m) PRIOR ART
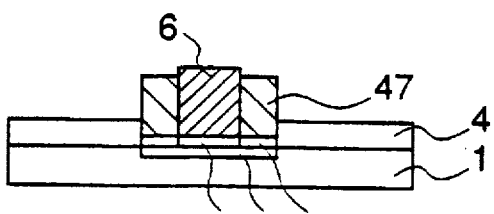
Fig.10 (n) PRIOR ART
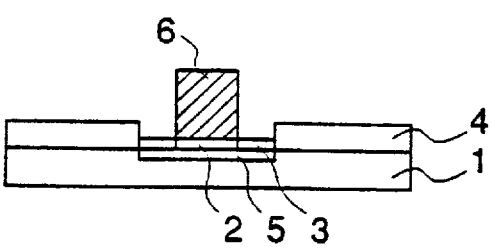
Fig.10 (o) PRIOR ART
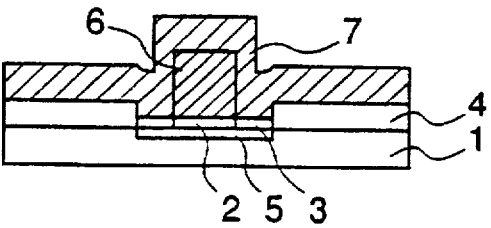
Fig.10 (p) PRIOR ART
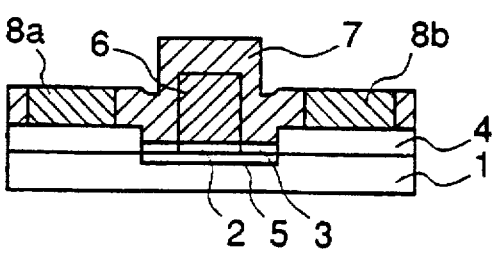

RECESSED GATE FIELD EFFECT TRANSISTOR

FIELD OF THE INVENTION

The present invention relates to a semiconductor device, such as a field effect transistor, including a refractory metal electrode, and a method of fabricating the semiconductor device.

BACKGROUND OF THE INVENTION

Generally, a field effect transistor (hereinafter referred to as FET) including a self-aligned refractory metal electrode is fabricated as a planar FET because it is difficult to produce the refractory metal electrode self-alignedly in the center of a recess. Although the FET including a self-aligned refractory metal electrode is inexpensive, it is ineligible as a high power FET and, therefore, it is used as a switch or a low-noise amplifier. However, both high power and low price are demanded of transistors used in portable telephone transmitters.

In order to meet the demand, the inventors of the present invention already proposed a method of fabricating a high-power and low-price transistor in which a refractory metal electrode is produced self-alignedly in the center of a recess and active regions are produced using self-aligned ion implantation process, in Japanese Patent Application No. Hei. 6-154717 (U.S. patent application No. 08/498,635).

In FETs employing compound semiconductors, n type layers are usually used as active layers, such as channel layers. Hereinafter, the channel layer is referred to as an n layer. In addition, a layer disposed under the channel layer and containing a dopant impurity producing a conductivity type opposite the conductivity type of the channel layer is a p type layer. Hereinafter, this p type layer is referred to as a p layer.

FIGS. 9(a) and 9(b) are cross-sectional views illustrating the FETs disclosed in the Japanese Patent Application No. Hei. 6-154717. In these figures, reference numeral 1 designates a compound semiconductor substrate. An n layer 2 is disposed on a center part of the substrate 1. First high dopant concentration layers (hereinafter referred to as n' layers) 3 having a dopant concentration higher than the dopant concentration of the n layer are disposed at opposite sides of and in contact with the n layer 2. Second high dopant concentration layers (hereinafter referred to as n$^+$ layers) 4 having a dopant concentration higher than the dopant concentration of the n' layers are disposed contacting the n' layers 3. A p layer 5 is disposed under the n layer 2 and the n' layers 3. A refractory metal gate electrode 6 is disposed on the n layer 2. Ohmic electrodes, i.e., source and drain electrodes, 8a and 8b are disposed on the n$^+$ layers 4. Reference numeral 7 designates an insulating film for passivation. The refractory metal gate electrode 6 is located in the center of the recess, and the gate electrode 6 is spaced apart from the n$^+$ layers 4 on the both sides thereof by the same distance. The n layer 2 is present only under the refractory metal gate electrode 6. The n' layers 3 are present within recess at the both sides of the n layer 2. The n$^+$ layers 4 are present outside the recess. The n$^+$ layers 4 are thicker than the n layer 2 and the n' layers 3. The top of the refractory metal gate electrode 6 is flat as shown in FIG. 9(a) or arched as shown in FIG. 9(b). Hereinafter, the FET structure with the flat-top gate electrode will be described.

FIGS. 10(a)–10(p) are cross-sectional views illustrating process steps in a method of fabricating the FET structure with the flat-top gate electrode shown in FIG. 9(a).

Initially, as illustrated in FIG. 10(a), an insulating film 41 is deposited on the compound semiconductor substrate 1 to a thickness of about 3000 Å, and a resist film 42 having a prescribed opening pattern is formed on the insulating film 41. Thereafter, as illustrated in FIG. 10(b), using the resist film 42 as a mask, the insulating film 41 is etched to form an opening. Preferably, the insulating film 41 is an SiO$_2$ film, and the etching technique is RIE (Reactive Ion Etching) which is excellent in etching perpendicular to a substrate surface.

In the step of FIG. 10(c), after removal of the resist film 42, a recess about 500 Å deep is formed in the compound semiconductor substrate 1 by etching. The recess etching may be performed before the removal of the resist 42. For the recess etching in the compound semiconductor substrate 1, wet etching using an aqueous solution of tartaric acid and hydrogen peroxide mixed in a ratio of 50:1 or dry etching using Cl$_2$ is employed. The recess shown in FIG. 10(c) is produced by dry etching.

In the step of FIG. 10(d), using the insulating film 41 as a mask, n type-producing dopant ions and p type-producing dopant ions are successively implanted into the compound semiconductor substrate 1 at the bottom of the recess, forming an n layer 2 and a p layer 5. Although these dopant ions are also implanted into the insulating film 41, since the concentration is as low as $10^{17}$ cm$^{-3}$, the composition of the insulating film 41 is hardly changed due to the dopant ions. In this ion implantation, Si ions are employed as the n type-producing dopant ions, and Mg ions are employed as the p type-producing dopant ions. The Si ions are implanted at an accelerating energy of 60 KeV and a dose of about $7\times10^{12}$ cm$^{-2}$. The Mg ions are implanted at an accelerating energy of 300 KeV and a dose of about $5\times10^{12}$ cm$^{-2}$. Since the implanted depth is about 1000 Å, the 3000 Å thick insulating film 41 comprising SiO$_2$ sufficiently serves as a mask for the ion implantation.

In the step of FIG. 10(e), a thin refractory metal film 6, such as WSi, WN, or TiW, is deposited over the entire surface of the substrate so that it is not disconnected at the edge of the insulating film 41 adjacent to the recess (hereinafter referred to as step part). The coverage of the refractory metal film 6 on the step part and the thickness of the refractory metal film 6 determine the width of the n' layer 3 and the gate length. For example, when the width of the refractory metal film 6 on the step part is 0.25 μm and the opening width of the recess is 1.0 μm, the gate length becomes 0.5 μm. As a method for depositing the refractory metal film 6, sputter deposition or blanket CVD is employed. The former method provides an arched-top gate as shown in FIG. 9(b) and the latter method provides a flat-top gate as shown in FIG. 9(a).

In the step of FIG. 10(f), a first resist 45 is deposited to a thickness sufficient to make the uneven (concave) surface of the refractory metal film 6 flat. A material resistant to RIE is used for the first resist 45, and it is deposited to a thickness of about 1 μm. Thereafter, as illustrated in FIG. 10(g), the first resist 45 is etched using an etching technique that provides a high uniformity across a wafer, such as O$_2$ ashing. The etching is stopped when the refractory metal film 6 is exposed. Since the ratio of the resist 45 filling the concavity of the refractory metal film 6 to the entire surface of the wafer is very small, if light emission from CO is monitored during the etching and the etching is stopped when the light emission from CO suddenly drops, i.e., when the refractory metal film is exposed, the resist 45 is left only in the concavity of the refractory metal film 6 with high controllability.

In the step of FIG. 10(h), using the resist 45 as a mask, the refractory metal film 6 is etched. Preferably, an etching technique that hardly damages or etches the n layer 2, such as plasma etching or ECR (Electron Cyclotron Resonance) etching, is employed. As an etching gas, $SF_6$ or a mixture of $CF_4$ and $O_2$ is employed. The etching is stopped when the insulating film 41 is exposed. The end point of the etching is easily detected by monitoring light emission from F radicals or light emission from SiF.

In the step of FIG. 10(i), after removal of the first resist 45, Si ions are implanted to form n' layers 3. Since the depth of the n' layers 3 is desired to be the same as the depth of the n layer 2, the Si ions are implanted at an accelerating energy of 60 KeV as in the ion implantation for the n layer 2. The dose depends on the desired breakdown voltage and transconductance. Thereafter, as illustrated in FIG. 10(j), a second resist 47 is deposited over the entire surface. The thickness of the second resist 47 is 1 µm, enough to bury the opening of the recess and the refractory metal gate electrode 6.

In the step of FIG. 10(k), the second resist 47 is etched by $O_2$ ashing, and the etching is stopped when the insulating film 41 is exposed. The principle and the method for detecting the end point of the etching are identical to those already described for the etching of the refractory metal film 6. In order to avoid unwanted mixing of a resist (not shown) masking a region of the substrate where the FET is not fabricated with the second resist 47 on both sides of the refractory metal gate in a subsequent ion implantation process for making $n^+$ layers 4, these resists must be reformed by deep UV curing.

In the step of FIG. 10(l), the insulating film 41 is removed with buffered hydrofluoric acid ($HF:NH_4F$=30:1) so that the refractory metal gate electrode 6, the second resist 47, and the compound semiconductor substrate 1 are not adversely affected by the etching and no residue is left.

Thereafter, as illustrated in FIG. 10(m), using the refractory metal gate 6 and the resist film 47 as masks, Si ions are implanted to form $n^+$ layers 4. A region of the substrate where the FET is not fabricated is masked with a resist although the resist is not shown in the figure. The energy of the ion implantation is set at 60~70 KeV so that the resist 47 can prevent the Si ions from reaching the n' layers 3, and it is desired that the bottom of the $n^+$ layers 4 be coplanar with the bottoms of the n layer 2 and the n' layers 3. The dose is about $5 \times 10^{13}$ cm$^{-2}$.

After removal of the second resist 47 (FIG. 10(n)), the ion-implanted layers are activated by annealing. This annealing is carried out at about 800° C. for about 30 min, in an ambient including As.

Then, as illustrated in FIG. 10(o), an insulating film 7 for passivation is deposited. The insulating film 7 must have a stress lower than $1 \times 10^9$ dyn/cm$^2$ to suppress the short channel effect due to a stress applied to the substrate. For example, the insulating film 7 comprises SiON and the deposition method is plasma CVD.

Finally, the insulating film 7 is etched using a resist mask (not shown) having openings opposite regions where source and drain electrodes are later fabricated, and ohmic electrodes, i.e., source and drain electrodes, 8a and 8b are fabricated using the lift-off technique, followed by sintering, whereby an FET is completed as shown in FIG. 10(p). An AuGe based alloy is used for the source and drain electrodes, and Ni is inserted between the substrate and the source and drain electrodes to reduce the contact resistance. The top surface of the refractory metal gate 6 of the completed FET is smooth and flat as shown in FIG. 10(p).

In the process of fabricating a semiconductor device, as described the refractory metal gate 6 is produced self-alignedly in the center of the recess, and the n layer 2 serving as a channel layer, the first high dopant concentration n' layers 3, the second high dopant concentration $n^+$ layers 4, and the p layer 5 disposed under these n type layers and having a conductivity type opposite to that of these n type layers are produced by self-aligning process using ion implantation. Therefore, a high-power and inexpensive transistor is obtained. However, in the transistor fabricated by the prior art method, since the controllable width of the n type channel layer 2 is adversely affected by a depletion layer produced at the interface between the first high dopant concentration n' layers 3 and the insulating film 7 for passivation, the response speed unfavorably varies in response to the charge and discharge time of carriers in traps produced at the interface. Further, it is difficult to control the width of the n' layer 3 which determines the operating speed, or the resistance to pressure of the transistor. Furthermore, optimization of the concentration of the p layer 5 for suppressing the short channel effect cannot be performed.

SUMMARY OF THE INVENTION

It is an object of the present invention to provide a semiconductor device that is not adversely affected by traps produced at the interface between the first high dopant concentration n' layers and the insulating film for passivation and that facilitates the control of the width of the n' layer.

It is another object of the present invention to provide a semiconductor device that is not adversely affected by the traps produced at the interface between the first high dopant concentration n' layers and the insulating film for passivation, that facilitates the control of the width of the n' layer, and that enables optimization of the p layer.

It is still another object of the present invention to provide methods for fabricating the described semiconductor devices.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a semiconductor device comprises a compound semiconductor body having a surface and a recess at the surface, the recess having a bottom and a hollow in the center of the bottom; and a refractory metal gate electrode having a lower portion buried in the hollow. The compound semiconductor body comprises a compound semiconductor substrate having a surface; a channel layer comprising a compound semiconductor of a first conductivity type, containing a dopant impurity, and having a dopant impurity concentration, the channel layer being located at a region of the surface of the compound semiconductor substrate directly between the gate electrode and the compound semiconductor substrate; first active layers comprising the compound semiconductor, of the first conductivity type, containing the dopant impurity, and having a dopant impurity concentration, the first active layers being located on regions of the surface of the compound semiconductor substrate in the recess where the channel layer is not present; and second active layers comprising the compound semiconductor, of the first conductivity type, containing the dopant impurity, and having a dopant impurity concentration, the second active layers being located on regions of the surface of the compound semiconductor substrate sandwiching the recess. Therefore, the controllable region in the channel layer is not adversely affected by a depletion layer produced at the interface between the first active layers and a passivation film, whereby unwanted reduction in the control speed in the channel layer due to the charge and discharge of carriers in traps produced at the interface is avoided.

According to a second aspect of the present invention, in the above-described semiconductor device, the dopant impurity concentration of the first active layers is higher than the dopant impurity concentration of the channel layer, and the dopant impurity concentration of the second active layers is higher than the dopant impurity concentration of the first active layers. Therefore, the high-frequency and high-output characteristics of the device are improved.

According to a third aspect of the present invention, the above-described semiconductor device further comprises a first compound semiconductor layer having a second conductivity type, opposite the first conductivity type, containing a dopant impurity, having a dopant impurity concentration, and being disposed under the channel layer and the first active layers. Therefore, a junction barrier producing between the second conductivity type layer and the first conductivity type layers suppresses the short channel effect.

According to a fourth aspect of the present invention, the semiconductor device further comprises a first compound semiconductor layer having a second conductivity type, opposite the first conductivity type, containing a dopant impurity, having a dopant impurity concentration, and being disposed under the channel layer; and second compound semiconductor layers having the second conductivity type, containing a dopant impurity, having a dopant impurity concentration, and being disposed under the first active layers. Therefore, the dopant impurity concentrations of the first and second compound semiconductor layers of the second conductivity type can be optimized individually, whereby the short channel effect is suppressed and, simultaneously, the high-frequency and high-output characteristics of the device are improved.

According to a fifth aspect of the present invention, in the above-described semiconductor device, the dopant impurity concentration of the first compound semiconductor layer is higher than the dopant impurity concentration of the second compound semiconductor layers. Therefore, the short channel effect is suppressed and, simultaneously, the high-frequency and high-output characteristics of the device are improved.

According to a sixth aspect of the present invention, in the above-described semiconductor device, the dopant impurity concentration of the second compound semiconductor layers is higher than the dopant impurity concentration of the first compound semiconductor layer. Therefore, the short channel effect is further suppressed.

According to a seventh aspect of the present invention, in the above-described semiconductor device, a concavity having a small width is produced between the inner side surface of the hollow and the side surface of the buried lower portion of the refractory metal gate electrode. Therefore, the gate breakdown voltage is increased.

According to an eighth aspect of the present invention, in the above-described semiconductor device, the width of the concavity is smaller than the buried depth of the lower portion of the refractory metal gate electrode. Therefore, the gate breakdown voltage is improved, and simultaneously, the high-frequency and high-output characteristics of the device are improved.

According to a ninth aspect of the present invention, a method of fabricating a semiconductor device comprises preparing a compound semiconductor substrate having a surface; depositing a first insulating film on the compound semiconductor substrate and forming an opening by removing a portion of the first insulating film; using the first insulating film having the opening as a mask, forming a recess in the compound semiconductor substrate; depositing a second insulating film on the first insulating film and in the opening of the first insulating film; depositing a first resist over the entire surface of the second insulating film and etching back the first resist, leaving a portion opposite the opening of the first insulating film; using the portion of the first resist as a mask, etching the second insulating film to produce a dummy electrode and, thereafter, removing the first resist; using the dummy electrode and the first insulating film as masks, implanting dopant ions producing a first conductivity type in the compound semiconductor substrate to form first high dopant concentration regions; depositing a second resist on the first insulating film and on the dummy electrode filling the opening in the first insulating film, and etching back the second resist to leave a portion within the opening of the insulating film; removing the dummy electrode comprising the second insulating film selectively with respect to the first insulating film to expose a portion of the compound semiconductor substrate in the recess; using the second resist as a mask, etching the exposed portion of the compound semiconductor substrate; using the second resist as a mask, implanting dopant ions producing the first conductivity type in the compound semiconductor substrate to form a channel region of the same conductivity type as the first high dopant concentration regions; depositing a thin refractory metal film on the first insulating film and on the second resist, filling the opening in the first insulating film; depositing a third resist on the refractory metal film and patterning the third resist to form a gate pattern; using the gate pattern as a mask, etching the refractory metal film and etching the first insulating film; using the gate pattern, the refractory metal film, and the second resist as masks, implanting dopant ions producing the first conductivity type in the compound semiconductor substrate to form second high dopant concentration regions of the same conductivity type as the first high concentration regions; removing the second resist and the third resist, followed by annealing; and forming spaced apart source and drain electrodes, followed by sintering. Therefore, a recessed gate FET in which the controllable region in the channel layer is not adversely affected by a depletion layer produced at the interface between the first active layers and a passivation film and unwanted reduction in the control speed in the channel layer due to the charge and discharge of carriers in traps produced at the interface is avoided, is fabricated self-alignedly. In addition, the width of the first active layer is easily controlled.

According to a tenth aspect of the present invention, the above-described method further includes, after formation of the recess in the compound semiconductor substrate and before deposition of the second insulating film, implanting dopant ions producing a second conductivity type, opposite the first conductivity type, in the compound semiconductor substrate to produce a second conductivity type compound semiconductor region. Therefore, the short channel effect is suppressed.

According to an eleventh aspect of the present invention, the above-described method further includes, after formation of the recess in the compound semiconductor substrate and before deposition of the second insulating film, implanting dopant ions producing a second conductivity type, opposite the first conductivity type, in the compound semiconductor substrate, thereby producing a second conductivity type compound semiconductor region; and after formation of the first high dopant concentration regions and before deposition of the second resist, implanting dopant ions producing the second conductivity type in the second conductivity type compound semiconductor region. Therefore, the short channel effect is suppressed.

According to a twelfth the above-described method further includes, after formation of the first high dopant concentration regions and before deposition of the second resist, implanting dopant ions producing a second conductivity type, opposite the first conductivity type, thereby producing first compound semiconductor regions of the second conductivity type only under the first high concentration regions; and after formation of the channel region and before deposition of the refractory metal film, implanting dopant ions producing the second conductivity type, thereby producing a second compound semiconductor region of the second conductivity type only under the channel region. Therefore, the first and second compound semiconductor layers of the second conductivity type can be optimized individually. Further, the short channel effect is suppressed and, simultaneously, the high-frequency and high-output characteristics of the device are improved.

BRIEF DESCRIPTION OF THE DRAWINGS

FIGS. 9(a) and 9(b) are cross-sectional views illustrating FETs according to the prior art.

FIGS. 10(a)–10(p) are cross-sectional views illustrating process steps in a method of fabricating the FET according to the prior art.

DETAILED DESCRIPTION OF THE PREFERRED EMBODIMENTS

[Embodiment 1]

Figure 1:
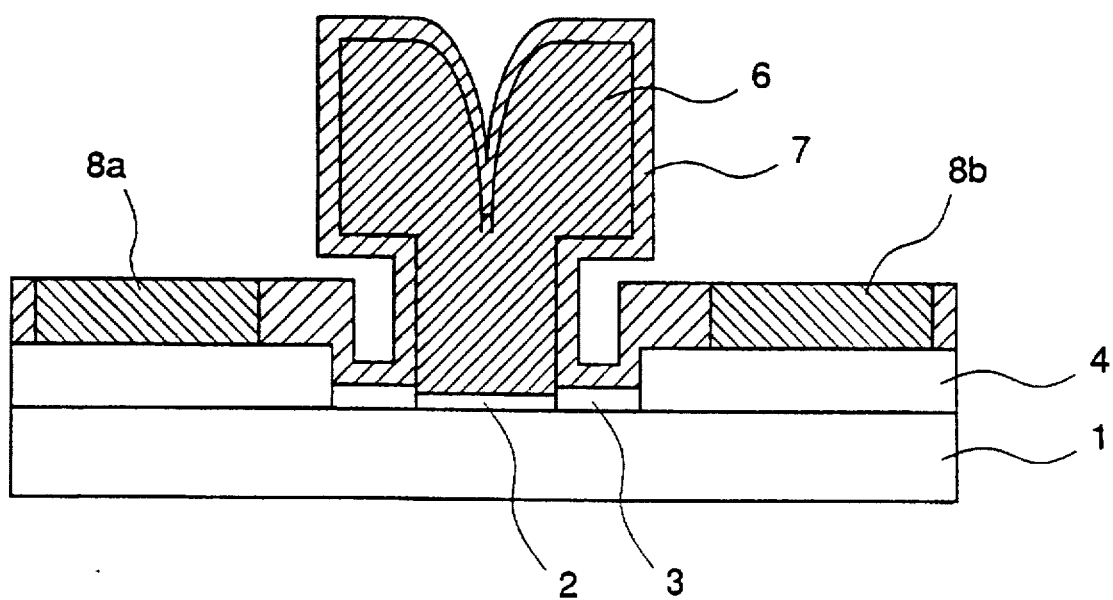
FIG. 1 is a cross-sectional view illustrating an FET in accordance with a first embodiment of the present invention.

FIG. 1 is a cross-sectional view illustrating an FET in accordance with a first embodiment of the present invention.

In FIG. 1, the same reference numerals as those in FIGS. 9(a) and 9(b) designate the same or corresponding parts. In this FET, the refractory metal gate electrode 6 is disposed in a hollow which is formed in the center of the recess, i.e., a lower part of the gate electrode 6 is buried in the hollow in the recess. The gate electrode 6 is spaced apart from the $n^+$ layers 4 on the both sides by the same distance. The n layer 2 is present only under the refractory metal gate electrode 6. The n' layers 3 are present within the recess at the both sides of the n layer 2. The $n^+$ layers 4 are present outside the recess. The $n^+$ layers 4 are thicker than the n layer 2 and the n' layers 3.

Figure 3:
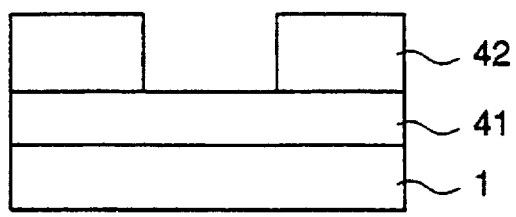
FIGS. 3(a)–3(q) are cross-sectional views illustrating process steps in a method of fabricating the FET according to the first embodiment of the invention.
Figure 3:
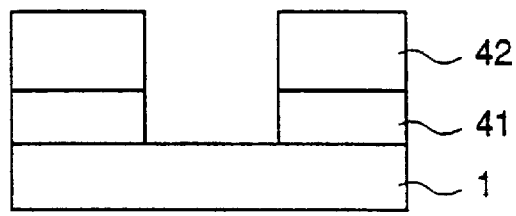
Figure 3:
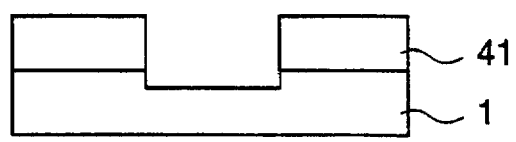
Figure 3:
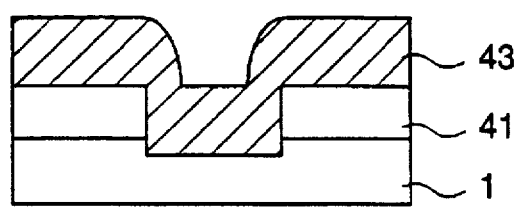
Figure 3:
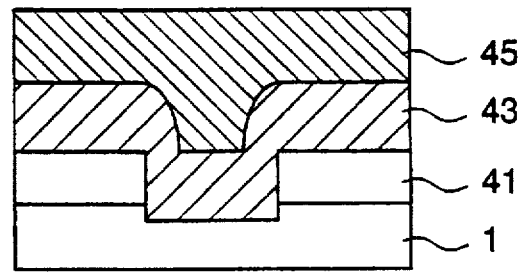
Figure 3:
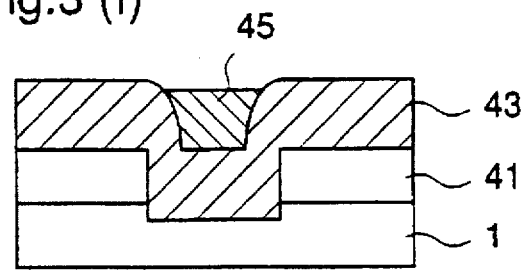
Figure 3:
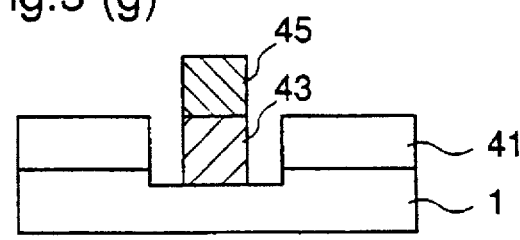
Figure 3:
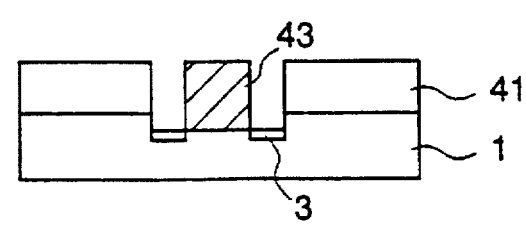
Figure 3:
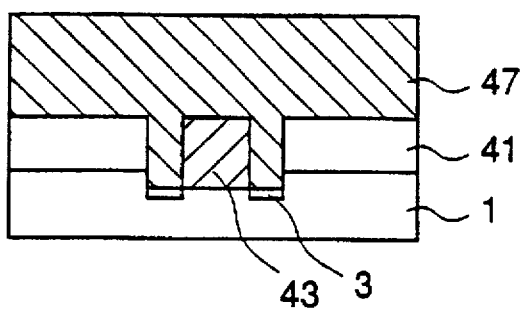
Figure 3:
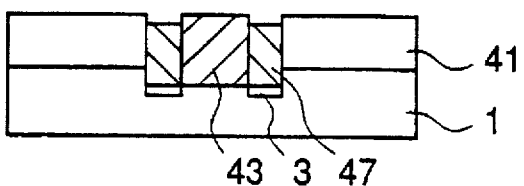
Figure 3:
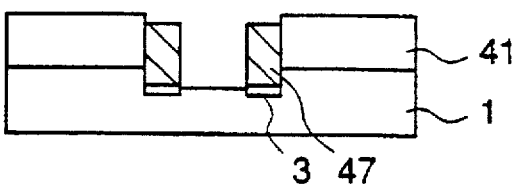
Figure 3:
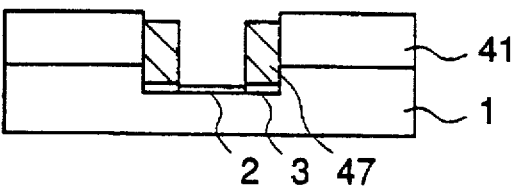
Figure 3:
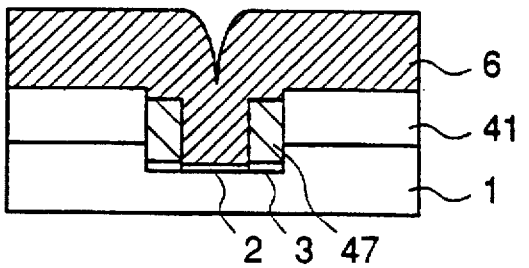
Figure 3:
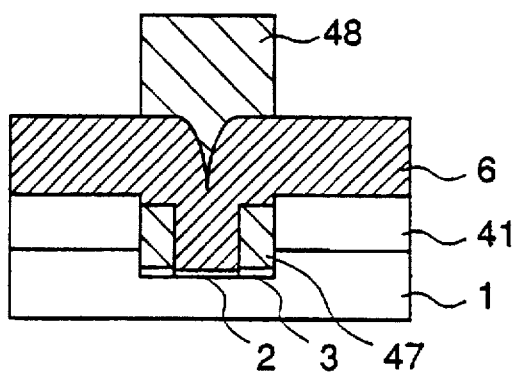
Figure 3:
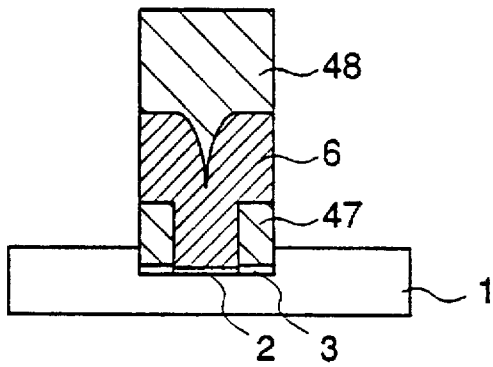
Figure 3:
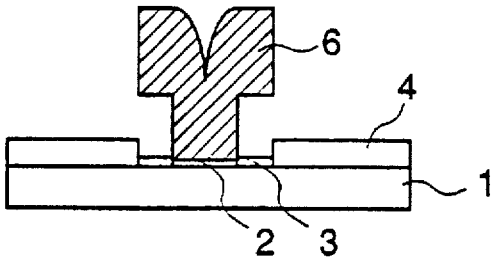
Figure 3:
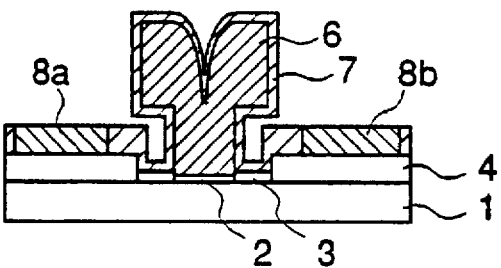

FIGS. 3(a)–3(q) are cross-sectional views illustrating process steps in a method of fabricating the FET shown in FIG. 1.

Initially, as illustrated in FIG. 3(a), an insulating film 41 is deposited on the compound semiconductor substrate 1 to a thickness of about 4000 Å, and a resist film 42 having a prescribed opening pattern is formed on the insulating film 41. Thereafter, as illustrated in FIG. 3(b), using the resist film 42 as a mask, the insulating film 41 is etched to form an opening. Preferably, the insulating film 41 is an $SiO_2$ film, and the etching technique is RIE (Reactive Ion Etching) which is excellent in etching perpendicular to the surface of a substrate.

In the step of FIG. 3(c), after removal of the resist film 42, a recess about 500 Å deep is formed in the compound semiconductor substrate 1 by etching. The recess etching may be performed before the removal of the resist 42. For the recess etching in the compound semiconductor substrate 1, wet etching using an aqueous solution of tartaric acid and hydrogen peroxide mixed in a ratio of 50:1 or dry etching using $Cl_2$ gas is employed. The recess shown in FIG. 3(c) is produced by dry etching.

In the step of FIG. 3(d), an insulating film 43 is deposited over the entire surface of the substrate so that it is not disconnected at the edge of the insulating film 41 adjacent to the recess (hereinafter referred to as step part). Preferably, the insulating film 43 comprises SiN. The coverage of the insulating film 43 on the step part and the thickness of the insulating film 43 determine the width of the n' layer 3 and the gate length. For example, when the width of the insulating film 43 on the step part is 0.25 μm and the opening width of the recess is 1.0 μm, the gate length becomes 0.5 μm. As a method for depositing the insulating film 43, plasma CVD or blanket CVD is employed. The former method provides an arched surface of the insulating film 43, and the latter method provides a flat surface of the insulating film 43. In FIG. 3(d), the insulating film 43 has a flat surface.

In the step of FIG. 3(e), a first resist 45 is deposited to a thickness sufficient to make the uneven (concave) surface of the insulating film 43 flat, for example, 1 μm. A material resistant to RIE is used for the first resist 45. Thereafter, as illustrated in FIG. 3(f), the first resist 45 is etched using an etching technique that provides a high uniformity across a wafer, such as $O_2$ ashing. The etching is stopped when the insulating film 43 is exposed. Since the ratio of the resist 45 filling the concavity of the insulating film 43 to the entire surface of the wafer is very small, if light emission from CO is monitored during the etching and the etching is stopped when the light emission from CO suddenly drops, i.e., when the insulating film 43 is exposed, the resist 45 is left only in the concavity of the insulating film 43 with high controllability. In the step of FIG. 3(g), using the resist 45 as a mask, the insulating film 43 is etched. Preferably, an etching technique that hardly damages or etches the surface of the compound semiconductor substrate 1, such as plasma etching or ECR (Electron Cyclotron Resonance) etching, is employed. As an etching gas, $SF_6$ or a mixture of $CF_4$ and $O_2$ is employed. The etching is stopped when the insulating film 41 is exposed. The end point of the etching is easily detected by monitoring light emission from F radicals or light emission from SiF. Portions of the insulating film 43 in the recess, other than the portion masked with the resist 45, are very poor in quality, i.e., porous, and the etching rate is very high in these portions. Therefore, although these portions of the insulating film 43 are thicker than the insulating film 43 on the flat surface of the insulating film 41, they are completely removed by the time the insulating film 41 is exposed. As a result of the etching, a dummy gate comprising the insulating film 43 is produced.

In the step of FIG. 3(h), after removal of the resist 45, Si ions for producing the n' layers 3 are implanted in the substrate. The energy of the ion implantation is 60 KeV to produce about 1000 Å thick n' layers 3. The dose depends on the desired breakdown voltage and transconductance.

In the step of FIG. 3(i), a second resist 47 is deposited over the entire surface. The thickness of the second resist 47 is 1 μm, enough to bury the opening of the recess and the dummy gate comprising the insulating film 43. Thereafter, as illustrated in FIG. 3(j), the second resist 47 is etched by $O_2$ ashing, and the etching is stopped when the insulating film 41 is exposed. The principle and the method for detecting the end point of the etching are identical to those already described for the etching of the first resist 43. In order to avoid unwanted mixing of a resist (not shown) masking a region of the substrate where the FET is not fabricated with the second resist 47 on both sides of the dummy gate in the subsequent ion implantation process for making $n^+$ layers 4, these resists must be reformed by deep UV curing.

Figure 4:
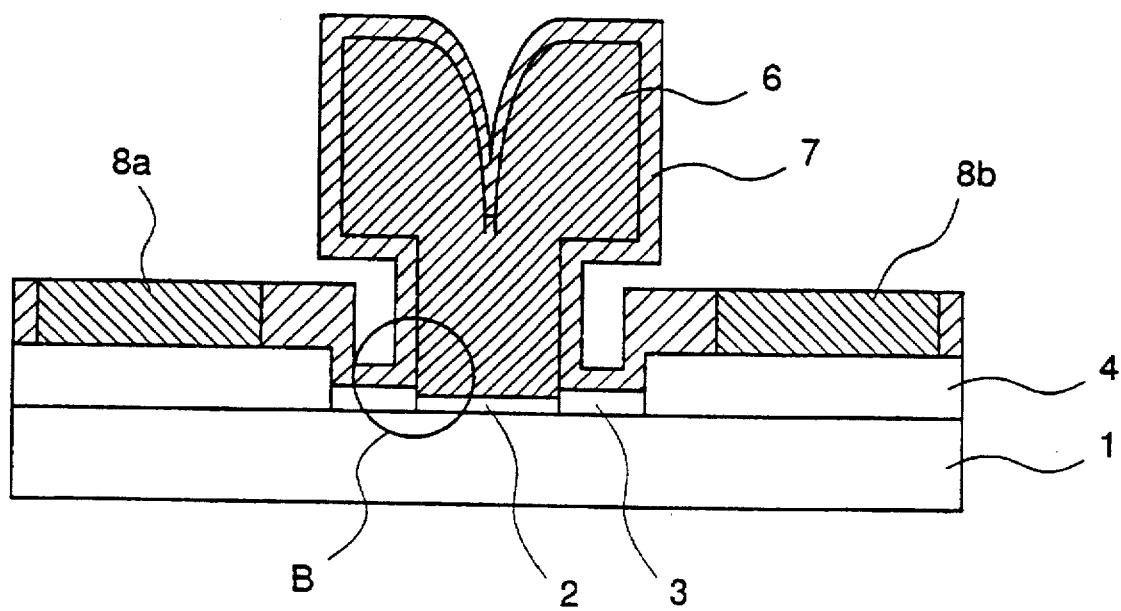
FIGS. 4(a) and 4(b) are cross-sectional views for explaining a difference in operation of the FET caused by a difference in shape of a hollow in which a gate electrode of the FET is disposed.
Figure 4:
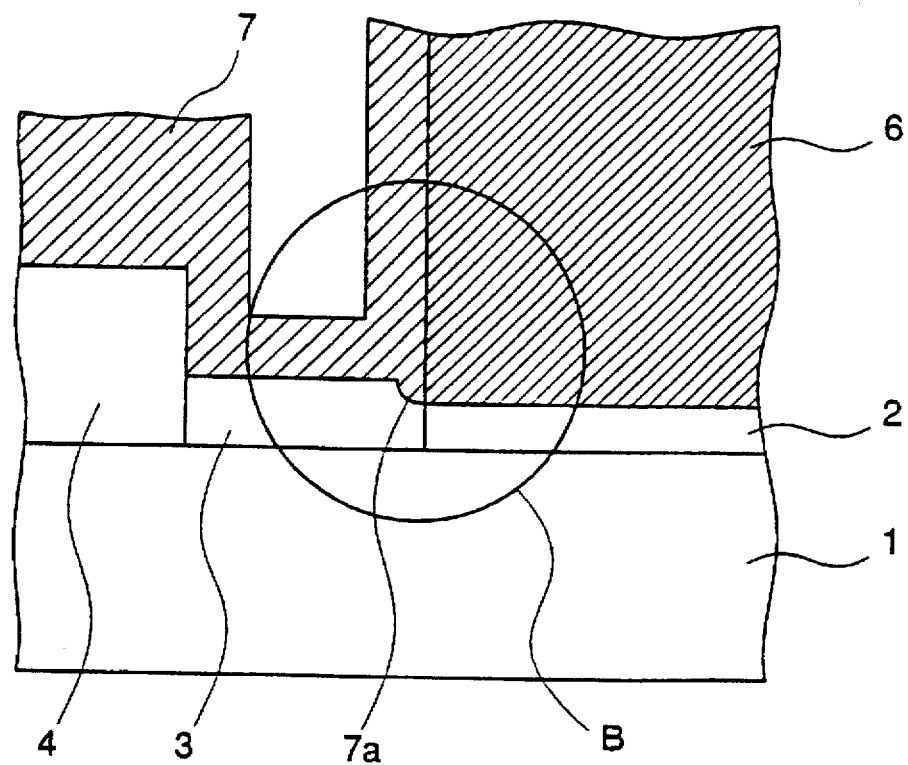

In the step of FIG. 3(k), the dummy gate comprising the insulating film 43 is removed, preferably by plasma etching using $SF_6$ or $NF_3$. When the insulating film 41 comprises SiO and the insulating film 43 comprises SiN, since the etching rate of the resist 47 and the SiO film are 100 Å/min and the etching rate of the SiN film is 2000 Å/min, only the dummy gate comprising the SiN film is selectively removed. Then, using the resist 47 and the insulating film 41 as masks, the portion of the compound semiconductor substrate 1 exposed by the removal of the dummy gate is etched. As in the fabrication of the recess in the compound semiconductor substrate 1, wet etching using an aqueous solution of tartaric acid and hydrogen peroxide mixed in a ratio of 50:1 or dry etching using $Cl_2$ gas is employed. The former is preferable to the latter for the purpose of reducing the contact area of the refractory metal gate electrode 6, which is later produced, with the n' layers 3. However, even when dry etching with $Cl_2$ gas is employed, as long as it is isotropic, it is possible to reduce the contact area of the refractory metal gate electrode 6 with the n' layers 3. The reason will be explained using FIGS. 4(a) and 4(b). When isotropic etching is carried out, the inner side 7a of the etched surface is rounded as shown in the section B in FIG. 4(b). Therefore, when the refractory metal gate electrode 6 is deposited after the isotropic etching, neither side of the gate electrode 6 contacts the n' layers 3, whereby the contact area of the refractory metal gate electrode 6 with the n' layers 3 is reduced. To reduce the contact area of the refractory metal gate electrode 6 with the n' layers 3 is an effective means for increasing the gate breakdown voltage of the FET. The etching depth is set at 400 Å so that the depletion layer produced at the interface between the n' layers 3 and the insulating film 7 for passivation does not adversely affect the controllable region of the n type channel layer 2.

In the step of FIG. 3(l), Si ions for producing the n layer 2 are implanted in the substrate 1. The energy of the ion implantation is 60 KeV to make the bottom of the n layer 2 even with the bottom of the n' layers 3. The dose depends on a desired pinch-off voltage. Thereafter, as illustrated in FIG. 3(m), a thin refractory metal film 6 is deposited so that it is not disconnected at the edge of the opening of the recess. Preferably, WSi, WSiN, WN, or TiW is employed as the refractory metal film 6.

In the step of FIG. 3(n), a gate pattern comprising a resist 48 is formed on the refractory metal film 6. Using the gate pattern as a mask, the refractory metal film 6 is etched by an etching technique that is excellent in producing surfaces perpendicular the surface of the substrate, such as RIE. A mixture of $CF_4$ and $O_2$ is used as the etching gas. The etching is stopped when the insulating film 41 is exposed. The end point of the etching is easily detected by monitoring light emission from SiF. Thereafter, the insulating film 41 is etched away with buffered hydrofluoric acid ($HF:NH_4F=$ 30:1) so that the etching does not damage the refractory metal gate electrode 6, the second resist 47, and the compound semiconductor substrate 1, and no residue is left. In order to avoid unwanted mixing of the resist masking a region of the substrate where the FET is not fabricated, second resist 47 on the both sides of the refractory metal gate 6, and the resist 48 on the refractory metal gate 6 in the subsequent ion implantation process for making $n^+$ layers, these resists must be reformed by deep UV curing.

In the step of FIG. 3(o), using the refractory metal gate electrode 6 and the resist films 47 and 48 as masks, Si ions are implanted into the substrate 1 to produce the $n^+$ layers 4. A region of the substrate where the FET is not fabricated is masked with a resist although the resist is not shown in the figure. The ion implantation is carried out at a relatively high energy of about 150 KeV to make the bottom of the $n^+$ layers 4 even with the bottoms of the n layer 2 and the n' layers 3. The dose is about $5 \times 10^{13}$ $cm^{-2}$. Since the mask alignment for forming the resist 48 is carried out by ordinary photolithographic techniques, the position of the resist 48 sometimes deviates from the position of the recess. In this case, it might be thought that an intrinsic portion of the substrate is left between the $n^+$ layer 4 and the n' layer 3. However, when the Si ions are applied to the substrate 1 in a direction inclined 10°~20° from the direction perpendicular to the surface of the substrate 1, the $n^+$ layer 4 is produced contacting the n' layer 3 even if the position of the resist 48 deviates from the position of the recess.

After removal of the second resist 47 and the resist 48, the ion-implanted layers are activated by annealing (FIG. 3(p)). This annealing is carried out at about 800° C. for about 30 min, in an ambient including As.

Then, as illustrated in FIG. 3(q), an insulating film 7 for passivation is deposited. The insulating film 7 must have a stress lower than $1 \times 10^9$ $dyn/cm^2$ to suppress the short channel effect. For example, the insulating film 7 comprises SiON and the deposition method is plasma CVD.

Finally, the insulating film 7 is etched using a resist mask (not shown) having openings opposite regions where source and drain electrodes are later fabricated, and ohmic electrodes, i.e., source and drain electrodes, 8a and 8b are fabricated using lift-off, followed by sintering, whereby an FET is completed as shown in FIG. 3(q). An AuGe based alloy is used for the source and drain electrodes, and Ni is inserted between the substrate and the source and drain electrodes to reduce the contact resistance.

A description is given of the advantages of the FET according to this first embodiment of the invention.

Figure 2:
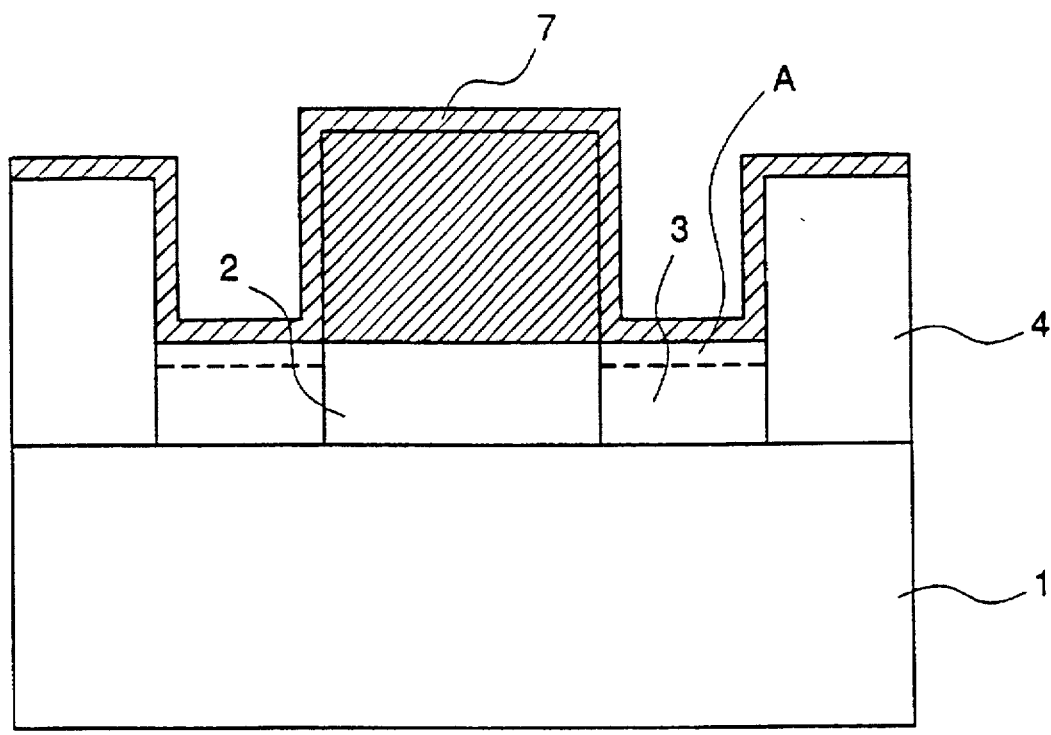
FIGS. 2(a) and 2(b) are cross-sectional views for explaining differences in structure and operation between the FET according to the first embodiment of the invention and an FET according to the prior art.
Figure 2:
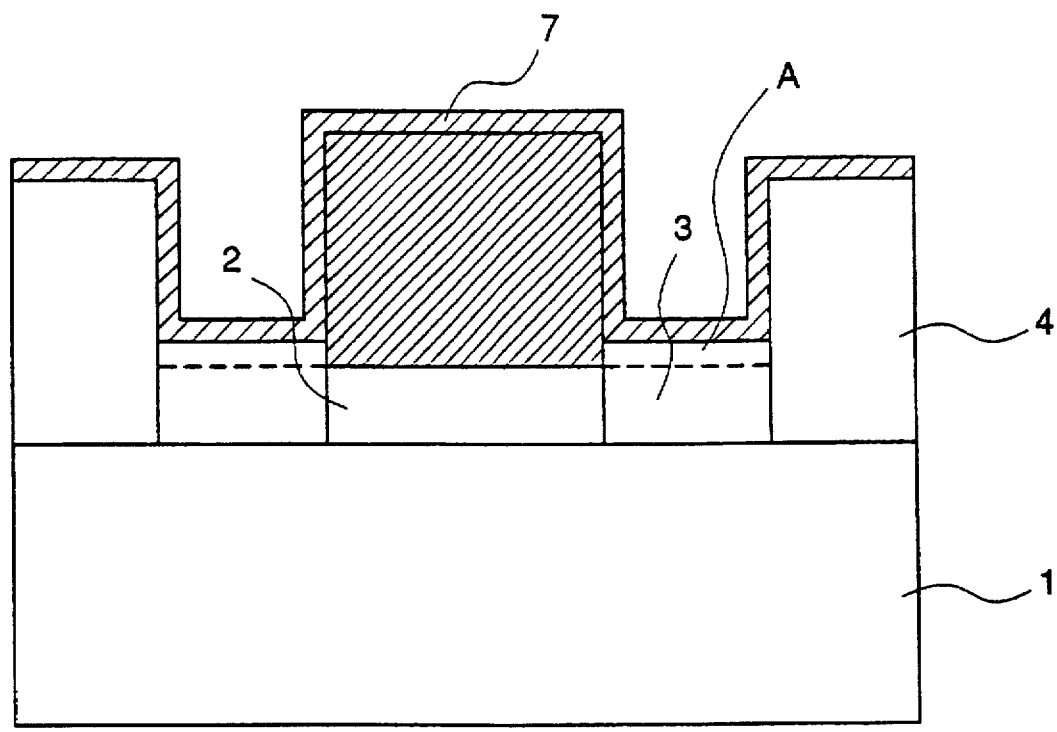

First of all, since the lower part of the refractory metal gate electrode 6 is buried in the hollow in the center of the recess, the channel layer 2 is hardly affected by the depletion layer produced at the interface between the n' layers 3 and the insulating film 7. Since carrier traps are produced at the interface between the n' layers 3 and the insulating film 7, the fact that the channel layer is hardly affected by the depletion layer means that the charge and discharge time of carriers in the traps does not determine the response speed of the FET. This advantage will be explained in more detail using FIGS. 2(a) and 2(b). A cross-sectional structure of a prior art FET is shown in FIG. 2(a), and cross-sectional structures of the n layer 2, n' layers 3, $n^+$ layers 4, and refractory metal gate 6 included in the FET according to this first embodiment are shown in FIG. 2(b). As shown in FIG. 2(a), in the prior art FET, the refractory metal gate 6 is disposed in the center of the bottom surface of the recess. In this case, when the gate is biased toward the plus side and the depletion layer under the gate 6 becomes as thick as the depletion layer A at the interface between the n' layer 3 and the insulating film 7, and more bias is applied toward the plus side, the channel layer 2 can no longer control current flowing in the active layer with high a degree of response. This is because the controllable region of the channel layer 2 is adversely affected by the depletion layer at the interface between the n' layers 3 and the insulating film 7. As a result, the transconductance gm of the FET is reduced. In addition, the operating speed of the FET is determined by the charge and discharge time of carriers in the traps produced at the interface between the n' layers 3 and the insulating film 7. In contrast to the prior art FET, in the FET according to the first embodiment of the invention, as shown in FIG. 2(b), the lower portion of the refractory metal gate electrode 6 is buried in the hollow formed in the center of the bottom of the recess. In this case, when the depth of the hollow is 400 Å, since the thickness of the depletion layer A at the interface between the n' layers 3 and the insulating film 7 is usually 300–400 Å, the channel layer is not adversely affected by the depletion layer A. As a result, a reduction in the transconductance gm of the FET and the reduction in a operation speed of the FET are avoided.

Second, since the dummy gate comprising an insulating film is used, the thickness of the gate electrode of the fabricated FET can be determined independent of the width of the n' layer 3. In the prior art method, in order to increase the width of the n' layer 3, the thickness of the refractory metal film 6 must be increased. As a result, the thickness of the gate electrode of the FET is increased. This means that the FET characteristics depending on the gate stress and the gate shape are varied when the width of the n' layer 3 is varied, and there is a risk of degrading the stability of the FET characteristics. In contrast to the prior art FET, in the FET according to the first embodiment, since the thickness of the gate electrode is determined independent of the width of the n' layer 3, the influences of gate stress and gate shape on the FET characteristics are not varied even when the width of the n' layer 3 is varied. Therefore, the stability of the FET characteristics is not degraded.

Third, since the implantation energy for producing the $n^+$ layers 4 can be increased, the bottom of the $n^+$ layers 4 is easily made even with the bottoms of the n layer 2 and the n' layers 3. In the prior art method, since the ion implantation for producing the $n^+$ layers 4 is carried out at a relatively low energy of 60–70 KeV so that the resist 47 can prevent the implanted Si ions from reaching into the n' layers 3, it is very difficult to make the bottom of the $n^+$ layers 4 even with the bottoms of the n layer 2 and the n' layers 3. This causes unwanted increase in the gate to source resistance and the gate to drain resistance, resulting in a reduction in the transconductance gm. In contrast to the prior art FET, in the FET according to the first embodiment of the invention, even when the implantation energy is as high as 150 KeV, since the resist 47, the resist 48, and the refractory metal gate 6 prevent the implanted ions from reaching into the n layer 2 and the n' layers 3, the bottom of the $n^+$ layers 4 is easily made even with the bottoms of the n layer 2 and the n' layers 3. Therefore, the gate to source resistance and the gate to drain resistance can be reduced to the limits, resulting in a maximum transconductance

[Embodiment 2]

Figure 5:
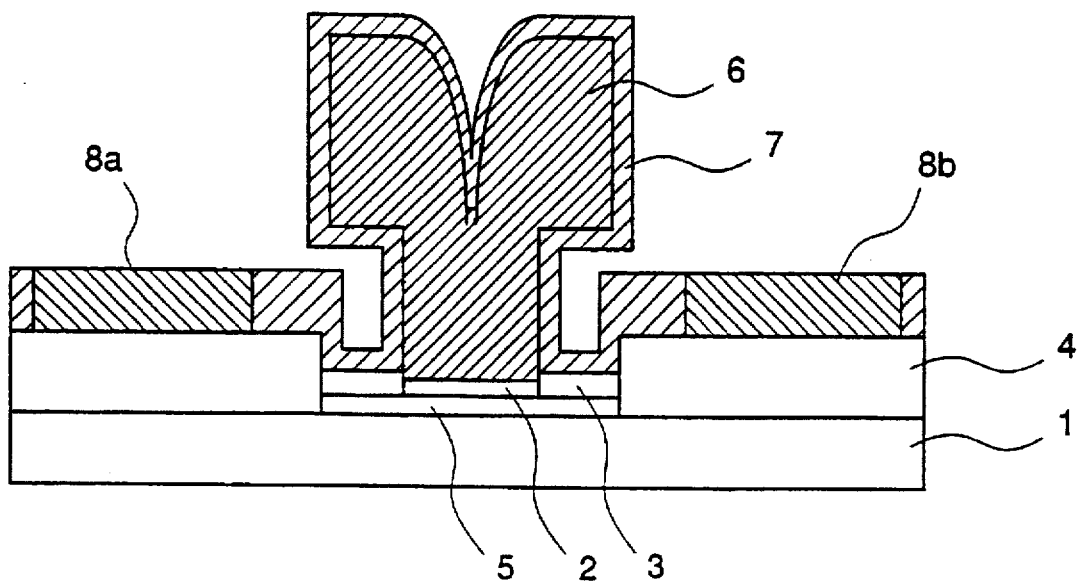
FIG. 5 is a cross-sectional view illustrating an FET in accordance with a second embodiment of the present invention.

FIG. 5 is a cross-sectional view illustrating an FET in accordance with a second embodiment of the present invention. In FIG. 5, the same reference numerals as those in FIG. 1 designate the same or corresponding parts. Reference numeral 5 designates a p layer. In this FET, the refractory metal gate electrode 6 is disposed in a hollow which is formed in the center of the recess, i.e., a lower part of the gate electrode 6 is buried in the hollow in the recess. The gate electrode 6 is spaced apart from the $n^+$ layers 4 on both sides thereof by the same distance. The n layer 2 is present only under the refractory metal gate electrode 6. The n' layers 3 are present within the recess at both sides of the n layer 2. The $n^+$ layers 4 are present outside the recess. The $n^+$ layers 4 are thicker than the n layer 2 and the n' layers 3. Further, the p layer 5 is present only under the n layer 2 and the n' layers 3. It is absent under the $n^+$ layers 4.

Figure 6:
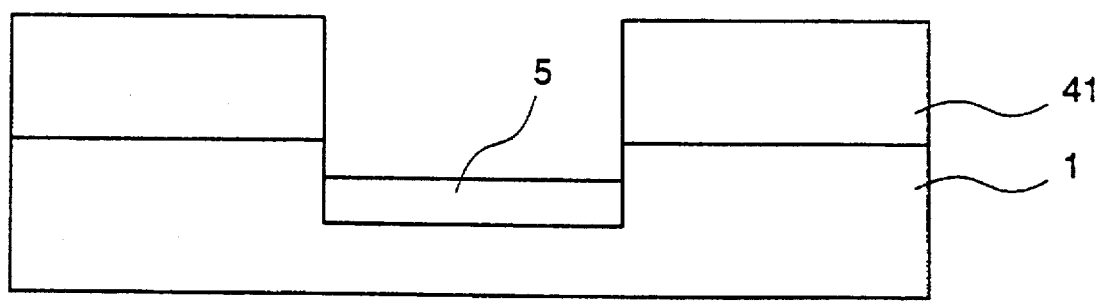
FIG. 6 is a cross-sectional view illustrating a process step in a method of fabricating the FET according to the second embodiment of the invention.

A description is given of the fabricating process of the FET shown in FIG. 5. The fundamental process steps for fabricating the FET are identical to those already described with respect to FIGS. 3(a)–3(q) except that, after the step of FIG. 3(c), the p layer 5 is formed by implanting p type-producing dopant ions into the substrate 1 in the recess using the insulating film 41 as a mask as shown in FIG. 6. The p type-producing dopant ions are Mg ions, and the Mg ions are implanted at an accelerating energy of about 300 KeV and a dose of about $5 \times 10^{12}$ cm$^{-2}$. Since the implanted depth is about 2000 Å, the insulating film 41 comprising a 4000 Å thick $SiO_2$ film is sufficient as a mask for the ion implantation. As a result of the ion implantation, the p layer 5 is produced only under the n layer 2 and the n' layers 3. After the formation of the p layer 5, the FET shown in FIG. 5 is completed in the same process steps as described in the first embodiment of the invention.

In the FET according to this second embodiment of the invention, the same effects as provided by the first embodiment are obtained. Further, since the p layer 5 is present under the n type active layer, the short channel effect is suppressed by a barrier of the pn junction. Furthermore, since the p layer 5 is present only under the n layer 2 and the n' layers 3 and absent under the $n^+$ layers 4, formation of an $n^+/p$ junction that provides the largest junction capacitance is avoided, thereby reducing parasitic capacitance. As a result, the operating speed of the FET is further increased.

[Embodiment 3]

Figure 7:
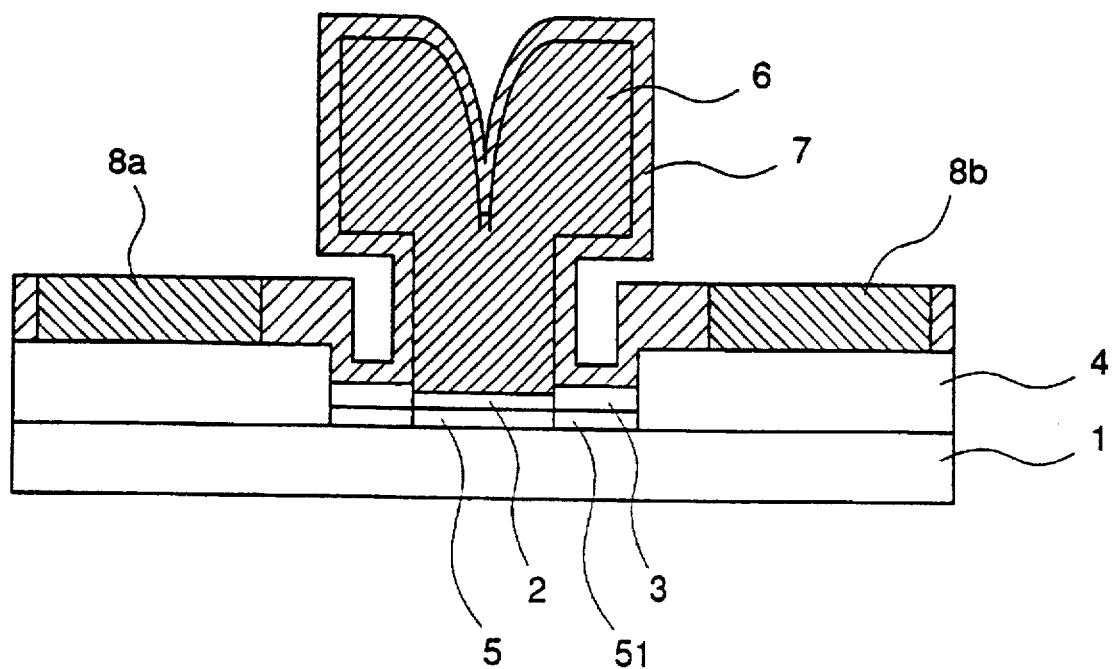
FIG. 7 is a cross-sectional view illustrating an FET in accordance with a third embodiment of the present invention.

FIG. 7 is a cross-sectional view illustrating an FET in accordance with a third embodiment of the present invention. In FIG. 7, the same reference numerals as those in FIG. 1 designate the same or corresponding parts. Reference numeral 5 designates a p layer and reference numeral 51 designate p' layers. In this FET, the refractory metal gate electrode 6 is disposed in a hollow which is formed in the center of the recess, i.e., a lower part of the gate electrode 6 is buried in the hollow in the recess. The gate electrode 6 is spaced apart from the n⁺ layers 4 on both sides thereof by the same distance. The n layer 2 is present only under the refractory metal gate electrode 6. The n' layers 3 are present within recess at the both sides of the n layer 2. The n⁺ layers 4 are present outside the recess. The n⁺ layers 4 are thicker than the n layer 2 and the n' layers 3. Further, the p layer 5 is present only under the n layer 2, and the p' layers 51 are present only under the n' layers 3. These p type layers are absent under the n⁺ layers 4.

Figure 8:
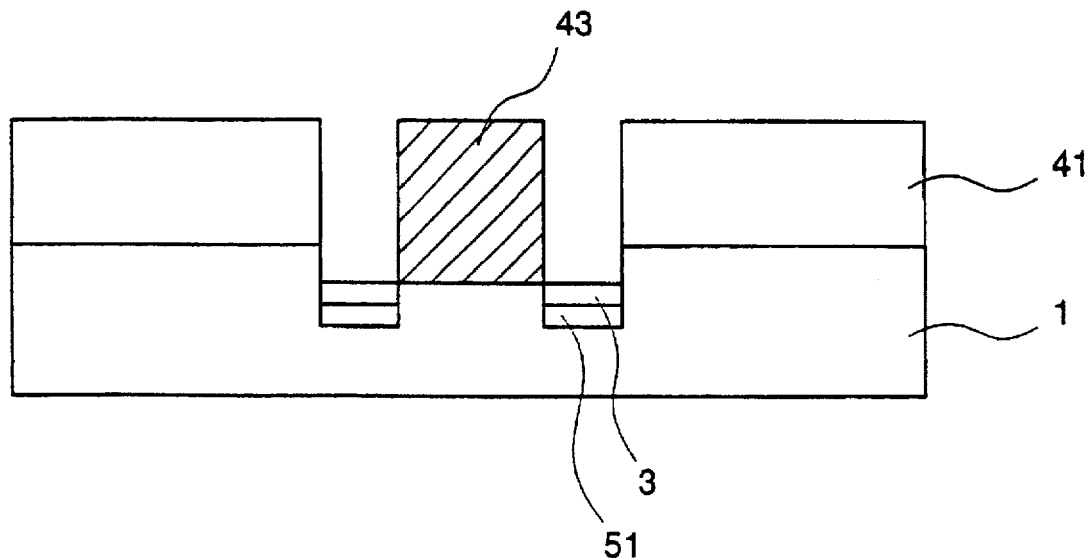
FIGS. 8(a) and 8(b) are cross-sectional views illustrating process steps in a method of fabricating the FET according to the second embodiment of the invention.
Figure 8:
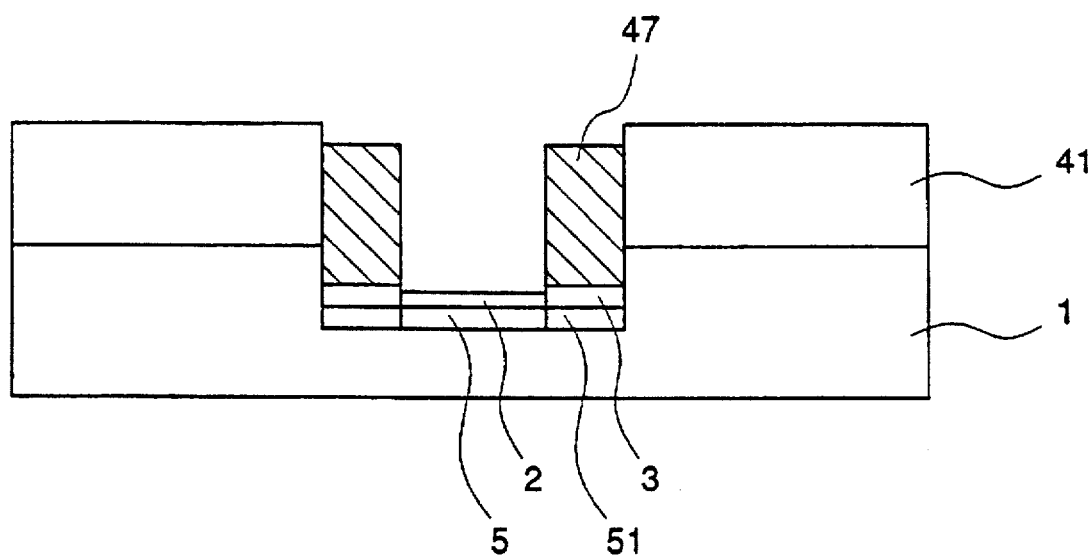

A description is given of the process of fabricating the FET shown in FIG. 7. The fundamental process steps are identical to those already described with respect to FIGS. 3(a)–3(q) except the following steps. That is, in the step of FIG. 3(h) where Si ions for producing the n' layers 3 are implanted, Mg ions for producing the p' layers 51 are implanted after the implantation of the Si ions as shown in FIG. 8(a). Further, in the step of FIG. 3(l) where Si ions for producing the n layer 2 are implanted, Mg ions for producing the p layer 5 are implanted after the implantation of the Si ions as shown in FIG. 8(b). In both steps, the Mg ions may be implanted before the implantation of the Si ions. More specifically, in the step of FIG. 8(a), the Si implanting energy is set at 60 KeV to produce about 1000 Å thick n' layers 3, and the Mg implanting energy is set at 300 KeV to produce the p' layers 51 under the n' layers 3. The dose of the Si ions depends on desired breakdown voltage and transconductance. Likewise, in the step of FIG. 8(b), the Si implanting energy is set at 60 KeV to make the bottom of the n layer 2 even with the bottom of the n' layers 3, and the Mg implanting energy is set at 300 KeV. The dose depends on a desired pinch-off voltage.

In the FET according to this third embodiment of the invention, the same effects as provided by the first and second embodiments are obtained. Further, since the concentrations of the p layer 5 and the p' layers 51 can be arbitrarily set, the n/p junction and the n'/p' junction can be optimized, thereby increasing the operating speed. The reason will be described hereinafter.

The capacitance C of the n/p junction is given by $$C = \epsilon_s / W$$

$$W = (2\epsilon_s(Vbi - 2k \cdot T/q)/q \cdot N_B)^{1/2}$$

$$N_B = (N_A + N_D)/(N_A \cdot N_D)$$

$$q \cdot Vbi = k \cdot T\ln(N_A \cdot N_D/n_i^2)$$

where $\epsilon_s$ is the dielectric constant of the compound semiconductor substrate, W is the thickness of the depletion layer, Vbi is the built-in potential, $N_A$ is the accepter dopant impurity concentration of the p layer, $N_D$ is the concentration of the donor impurity concentration n layer, $n_i$ is the carrier concentration of the intrinsic semiconductor, k is Boltzmann's constant, T is the temperature, and q is the elementary charge. The dependence of the capacitance C on $N_A$ and $N_D$ under the condition that $N_A \cdot N_D$=constant at a constant q·Vbi required for suppressing the short channel effect is given by $$C \propto N_B^{1/2} = (N_A + N_D)^{1/2}$$

That is, the capacitance C is reduced to the minimum by reducing $N_A$ in a region where $N_D$ is large and increasing $N_A$ in a region where $N_D$ is small.

Generally, since the dopant concentration of the n' layer 3 is higher than the dopant concentration of the n layer 2, in order to optimize the n/p junction and the n'/p' junction, the concentration of the p' layer 51 must be lower than the concentration of the p layer 5. For example, in the FET according to the above-described second embodiment, since only the p layer 5 is the p type layer for suppressing the short channel effect, the dopant concentrations of the n, n', and p layers must be set as follows: n=1×10¹⁷ cm⁻³, n'=2×10¹⁷ cm⁻³, p=2×10¹⁷ cm⁻³. On the other hand, in the FET according to this third embodiment of the invention, since both the p layer 5 and the p' layers 51 are provided, the dopant concentrations of the n, n', p, and p' layers are set as follows: n=1×10¹⁷ cm⁻³, n'=2×10¹⁷ cm⁻³, p=2×10¹⁷ cm⁻³, p'=1×10¹⁷ cm⁻³. As a result, the parasitic capacitance in the FET according to this third embodiment is reduced to, as roughly estimated, ⅔ (=(1×2+2×1)/(1×2+2×2)) of the parasitic capacitance in the FET according to the second embodiment. In order to reduce the parasitic capacitance of the FET, it is very important to make the concentration of the p' layer 51 lower than the concentration of the p layer 5 as described above. In the FET according to this third embodiment, since the parasitic capacitance is reduced as described above, the operating speed is further increased.

In this third embodiment of the invention, emphasis has been placed upon an FET in which the operating speed is increased by setting the concentrations of the p layer 5 and the p' layer 51 as p>p'. However, there is a case where reduction of the short channel effect is desired at the sacrifice of the operating speed. In this case, the concentrations of the p layer 5 and the p' layer 51 are set as p<p' to produce a higher junction barrier.

Furthermore, in the first to third embodiments of the invention, emphasis has been placed upon an FET which is fabricated by ion implantation into a compound semiconductor substrate. However, the present invention may be applied to an FET in which a recess is produced in an epitaxial substrate without using ion implantation. Alternatively, the invention may be applied to a semiconductor device in which a gate electrode is buried in a recessed portion of a heterojunction device.

What is claimed is:

1. A semiconductor device comprising:
   a compound semiconductor body having a surface and a recess at the surface, the recess having a bottom and a hollow in the center of the bottom; and
   a refractory metal gate electrode having a lower portion disposed within the hollow, the compound semiconductor body comprising:
      a compound semiconductor structure having a surface;
      a channel layer comprising a compound semiconductor of a first conductivity type, containing a dopant impurity, and having a dopant impurity concentration, the channel layer being located at a region of the surface of the compound semiconductor substrate directly between the gate electrode and the compound semiconductor substrate;
      first active layers comprising the compound semiconductor, of first conductivity type, containing the dopant impurity, and having a dopant impurity concentration, the first active layers being located on regions of the surface of the compound semiconductor substrate in the recess where the channel layer is not present; and
      second active layers comprising the compound semiconductor, of the first conductivity type, containing the dopant impurity, and having a dopant impurity concentration, the second active layers being located on regions of the surface of the compound semiconductor substrate sandwiching the recess, wherein the dopant impurity concentration of the first active layers is higher than the dopant impurity concentration of the channel layer, and the dopant impurity concentration of the second active layers is higher than the dopant impurity concentration of the first active layers.

2. The semiconductor device of claim 1 wherein the compound semiconductor body further comprises a first compound semiconductor layer having a second conductivity type, opposite the first conductivity type, containing a dopant impurity, and having a dopant impurity concentration, the first compound semiconductor layer being disposed on a side of the channel layer and the first active layers opposite a side where the refractory metal gate electrode is located.

3. The semiconductor device of claim 1 wherein the compound semiconductor body comprises:

a first compound semiconductor layer having a second conductivity type, opposite the first conductivity type, containing a dopant impurity, and having a dopant impurity concentration, the first compound semiconductor layer being disposed on a side of the channel layer opposite a side where the refractory metal gate electrode is located; and second compound semiconductor layers having the second conductivity type, containing a dopant impurity, and having a dopant impurity concentration, the second compound semiconductor layers being disposed on a side of the first active layers opposite a side where the refractory metal gate electrode is located.

4. The semiconductor device of claim 3 wherein the dopant impurity concentration of the first compound semiconductor layer is higher than the dopant impurity concentration of the second compound semiconductor layers.

5. The semiconductor device of claim 3 wherein the dopant impurity concentration of the second compound semiconductor layers is higher than the dopant impurity concentration of the first compound semiconductor layer.

6. A semiconductor device comprising:

a compound semiconductor body having a surface and a recess at the surface, the recess having a bottom and a hollow in the center of the bottom; and a refractory metal gate electrode having a lower portion disposed within the hollow, the compound semiconductor body comprising:

a compound semiconductor structure having a surface;

a channel layer comprising a compound semiconductor of a first conductivity type, containing a dopant impurity, and having a dopant impurity concentration, the channel layer being located at a region of the surface of the compound semiconductor substrate directly between the gate electrode and the compound semiconductor substrate;

first active layers comprising the compound semiconductor, of first conductivity type, containing the dopant impurity, and having a dopant impurity concentration, the first active layers being located on regions of the surface of the compound semiconductor substrate in the recess where the channel layer is not present; and second active layers comprising the compound semiconductor, of the first conductivity type, containing the dopant impurity, and having a dopant impurity concentration, the second active layers being located on regions of the surface of the compound semiconductor substrate sandwiching the recess, wherein the compound semiconductor body further comprises a first compound semiconductor layer having a second conductivity type, opposite the first conductivity type, containing a dopant impurity, and having a dopant impurity concentration, the first compound semiconductor layer being disposed on a side of the channel layer and the first active layers opposite a side where the refractory metal gate electrode is located.

7. A semiconductor device comprising:

a compound semiconductor body having a surface and a recess at the surface, the recess having a bottom and a hollow in the center of the bottom; and a refractory metal gate electrode having a lower portion disposed within the hollow, the compound semiconductor body comprising:

a compound semiconductor structure having a surface;

a channel layer comprising a compound semiconductor of a first conductivity type, containing a dopant impurity, and having a dopant impurity concentration, the channel layer being located at a region of the surface of the compound semiconductor substrate directly between the gate electrode and the compound semiconductor substrate;

first active layers comprising the compound semiconductor, of first conductivity type, containing the dopant impurity, and having a dopant impurity concentration, the first active layers being located on regions of the surface of the compound semiconductor substrate in the recess where the channel layer is not present;

second active layers comprising the compound semiconductor, of the first conductivity type, containing the dopant impurity, and having a dopant impurity concentration, the second active layers being located on regions of the surface of the compound semiconductor substrate sandwiching the recess;

a first compound semiconductor layer having a second conductivity type, opposite the first conductivity type, containing a dopant impurity, and having a dopant impurity concentration, the first compound semiconductor layer being disposed on a side of the channel layer opposite a side where the refractory metal gate electrode is located; and second compound semiconductor layers having the second conductivity type, containing a dopant impurity, and having a dopant impurity concentration, the second compound semiconductor layers being disposed on a side of the first active layers opposite a side where the refractory metal gate electrode is located.

8. The semiconductor device of claim 7 wherein the dopant impurity concentration of the first compound semiconductor layer is higher than the dopant impurity concentration of the second compound semiconductor layers.

9. The semiconductor device of claim 7 wherein the dopant impurity concentration of the second compound semiconductor layers is higher than the dopant impurity concentration of the first compound semiconductor layer.

10. A semiconductor device comprising:

a compound semiconductor body having a surface and a recess at the surface, the recess having a bottom and a hollow in the center of the bottom; and a refractory metal gate electrode having a lower portion disposed within the hollow, the compound semiconductor body comprising :

a compound semiconductor structure having a surface;

a channel layer comprising a compound semiconductor of a first conductivity type, containing a dopant impurity, and having a dopant impurity concentration, the channel layer being located at a region of the surface of the compound semiconductor substrate directly between the gate electrode and the compound semiconductor substrate;

first active layers comprising the compound semiconductor, of first conductivity type, containing the dopant impurity, and having a dopant impurity concentration, the first active layers being located on regions of the surface of the compound semiconductor substrate in the recess where the channel layer is not present; and second active layers comprising the compound semiconductor, of the first conductivity type, containing the dopant impurity, and having a dopant impurity concentration, the second active layers being located on regions of the surface of the compound semiconductor substrate sandwiching the recess, wherein each of the first active layers includes a recess at a surface of the respective first active layers opposite the semiconductor substrate and adjacent the hollow, extending from an interface of the channel layer and a refractory metal gate electrode into only part of the respective first active layer.

11. The semiconductor device of claim 10 wherein each recess has a width in the respective first active layer smaller than a depth of the hollow relative to the surfaces of the first active layers opposite the semiconductor substrate.

* * * * *